(12) United States Patent
Lee et al.

(10) Patent No.: US 12,444,332 B2
(45) Date of Patent: Oct. 14, 2025

(54) DISPLAY DEVICE AND INSPECTION METHOD THEREOF

(71) Applicant: Samsung Display Co., Ltd., Yongin-si (KR)

(72) Inventors: Joon-Ik Lee, Seoul (KR); Dong Hyeon Lee, Seoul (KR); Chang Moo Lee, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 762 days.

(21) Appl. No.: 17/534,235

(22) Filed: Nov. 23, 2021

(65) Prior Publication Data

US 2022/0262279 A1 Aug. 18, 2022

(30) Foreign Application Priority Data

Feb. 18, 2021 (KR) .......................... 10-2021-0021911

(51) Int. Cl.
*G09G 3/00* (2006.01)

(52) U.S. Cl.
CPC .............. *G09G 3/006* (2013.01); *G09G 3/03* (2020.08)

(58) Field of Classification Search
CPC .. G09G 3/006; G09G 3/03; G09F 9/30; G09F 9/301; H10K 59/00; H10K 71/00; H10K 77/111; H10K 50/84
See application file for complete search history.

(56) References Cited

U.S. PATENT DOCUMENTS

| | | | |
|---|---|---|---|
| 9,490,215 B2 | 11/2016 | Yang | |
| 11,004,912 B2 | 5/2021 | Kim et al. | |
| 11,069,762 B2 | 7/2021 | Chung et al. | |
| 2014/0042406 A1* | 2/2014 | Degner | H10K 77/111 438/34 |
| 2018/0027673 A1* | 1/2018 | Andou | H05K 1/028 361/749 |
| 2022/0181408 A1 | 6/2022 | Ji et al. | |

FOREIGN PATENT DOCUMENTS

| | | |
|---|---|---|
| KR | 10-2013-0097629 | 9/2013 |
| KR | 10-2015-0059048 | 5/2015 |
| KR | 1020150114407 A | 10/2015 |
| KR | 10-2018-0011443 | 2/2018 |
| KR | 10-1931338 | 12/2018 |
| KR | 1020190107259 A | 9/2019 |
| KR | 10-2020-0064217 | 6/2020 |
| KR | 1020200119957 A | 10/2020 |

* cited by examiner

*Primary Examiner* — Abhishek Sarma
(74) *Attorney, Agent, or Firm* — CANTOR COLBURN LLP

(57) ABSTRACT

A display device includes a display panel including: a bending region bent along an axis extending in a first direction; a window disposed on the first surface of the display panel; and a mark disposed on the bending region of the display panel and disposed along a second direction different from the first direction, wherein a first portion of the mark and a second portion of the mark different from the first portion do not overlap along the first direction of the display panel on which the window is disposed.

16 Claims, 17 Drawing Sheets

(a)            (b)

(a)          (b)

(a)            (b)

DISPLAY DEVICE AND INSPECTION METHOD THEREOF

CROSS-REFERENCE TO RELATED APPLICATION

This application claims priority from and the benefit of Korean Patent Application No. 10-2021-0021911, filed on Feb. 18, 2021, which is hereby incorporated by reference for all purposes as if fully set forth herein.

BACKGROUND

Field

Embodiments of the invention relate generally to a display device and an inspection method thereof.

Discussion of the Background

Flat panel displays include a liquid crystal display (LCD), a plasma display panel (PDP), an organic light emitting diode (OLED) display, a field effect display (FED), an electrophoretic display, etc.

In order to increase a screen-to-body ratio of the display device, that is, a ratio occupied by the screen when the display device is viewed from the front, a device in which the display area is extended to the side of the display device has been developed.

In this way, in the case of a display device of which the display area is extended to a side of the display device, a display panel and a driving film are bent according to the shape of an outer window surrounding the display panel, and thus an inspection to determine whether the display panel and the driving film are bent correctly to be positioned at the correct position must be performed.

The above information disclosed in this Background section is only for understanding of the background of the inventive concepts, and, therefore, it may contain information that does not constitute prior art.

SUMMARY

Devices constructed according to embodiments of the invention are capable of extending a display area to a side of a display device.

Embodiments are to provide a display device and an inspection method capable of accurately determining whether a display device having a display area that is extended to a side of the display device is bent in an appropriate manner to enable a user to view an image on both the front and the side of the display device.

Additional features of the inventive concepts will be set forth in the description which follows, and in part will be apparent from the description, or may be learned by practice of the inventive concepts.

A display device according to an embodiment includes a display panel including: a bending region bent along an axis extending in a first direction; a window disposed on the first surface of the display panel; and a mark disposed on the bending region of the display panel and disposed along a second direction different from the first direction, wherein a first portion of the mark and a second portion of the mark separate from the first portion do not overlap along the first direction of the display panel on which the window is disposed.

A first end of the mark may be disposed adjacent to the window, and a second end of the mark may be disposed on a plane parallel to a second surface of the display panel opposite to the first surface of the display panel.

The first end and the second end are disposed on first and second sides along the first direction of the display panel and are curved surfaces.

A first side surface and a second side surface disposed on the first and second sides along the first direction of the display panel and are curved surfaces.

The display panel may include a first display area and a second display area extending from an edge of the first display area to surround the first display area, the first display area is a relatively flat surface, and the second display area is a relatively curved surface.

The mark may have a straight line shape extending in the second direction.

The mark may include a plurality of patterns arranged in the second direction.

The mark may include one or more of a plurality of quadrangle patterns, a plurality of circle patterns, and a plurality of triangle patterns.

The mark may include a first sub-pattern and a second sub-pattern, and at least one of the first sub-pattern and the second sub-pattern may include a plurality of patterns arranged in the second direction.

One of the first sub-pattern and the second sub-pattern may have a straight line shape extending in the second direction.

An inspection method of a display device according to an embodiment includes: forming a mark in a bending region display panel that is configured to be bent from a first surface of the display panel on which a window is disposed; bending the bending region of the display panel along an axis extending in a first direction; detecting a position of an edge of the window disposed on the first surface of the display panel and a position of the mark; and inspecting the bending region by using the detected positions, wherein the mark extends along a second direction different from the first direction.

In the detecting of the positions, the detecting may be performed by using a detecting unit at the position viewing a second surface of the display panel disposed to the opposite side to the first surface along a direction forming a certain angle with the direction vertical to the first surface of the display panel.

In the detecting of the positions, a first length of the portion of the mark that is visually recognized along the second direction by the detecting unit may be detected.

In the detecting of the positions, a second length that is a minimum interval between the recognized portion of the mark and the edge of the window may be detected.

According to the embodiment, it is possible to accurately determine whether or not the display device in which the display area extends to the side surface of the display device is bent.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
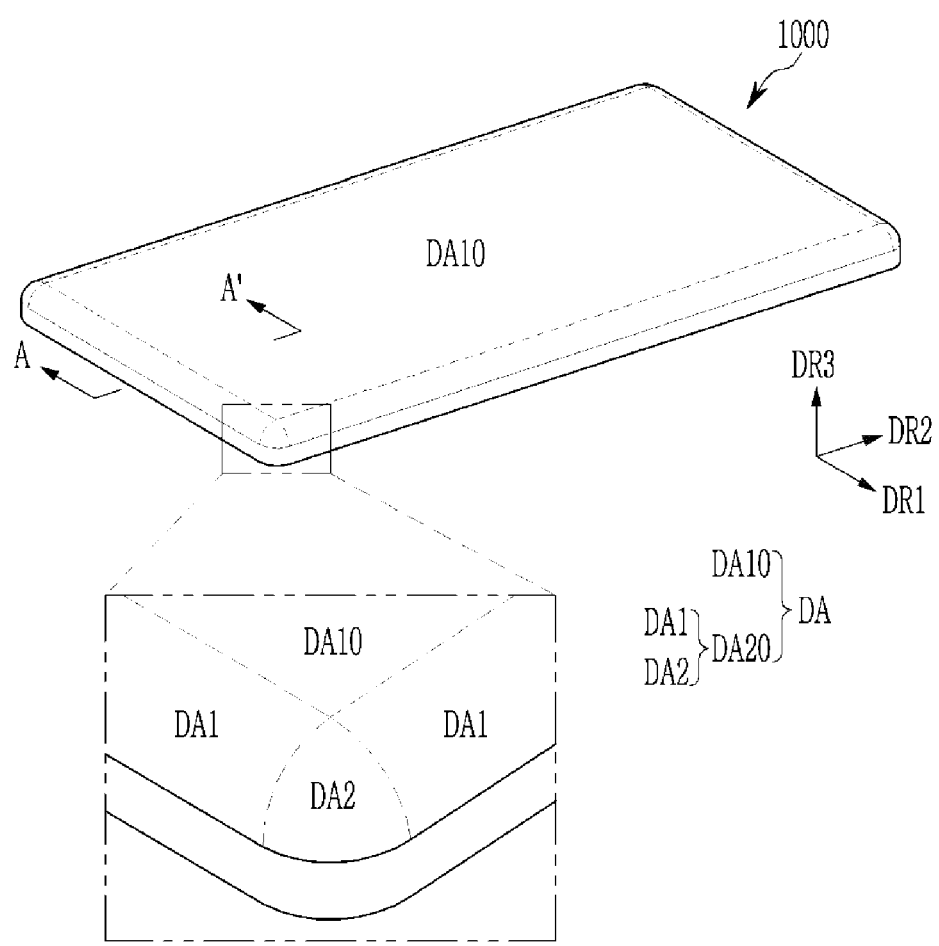
FIG. 1 is a perspective view of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
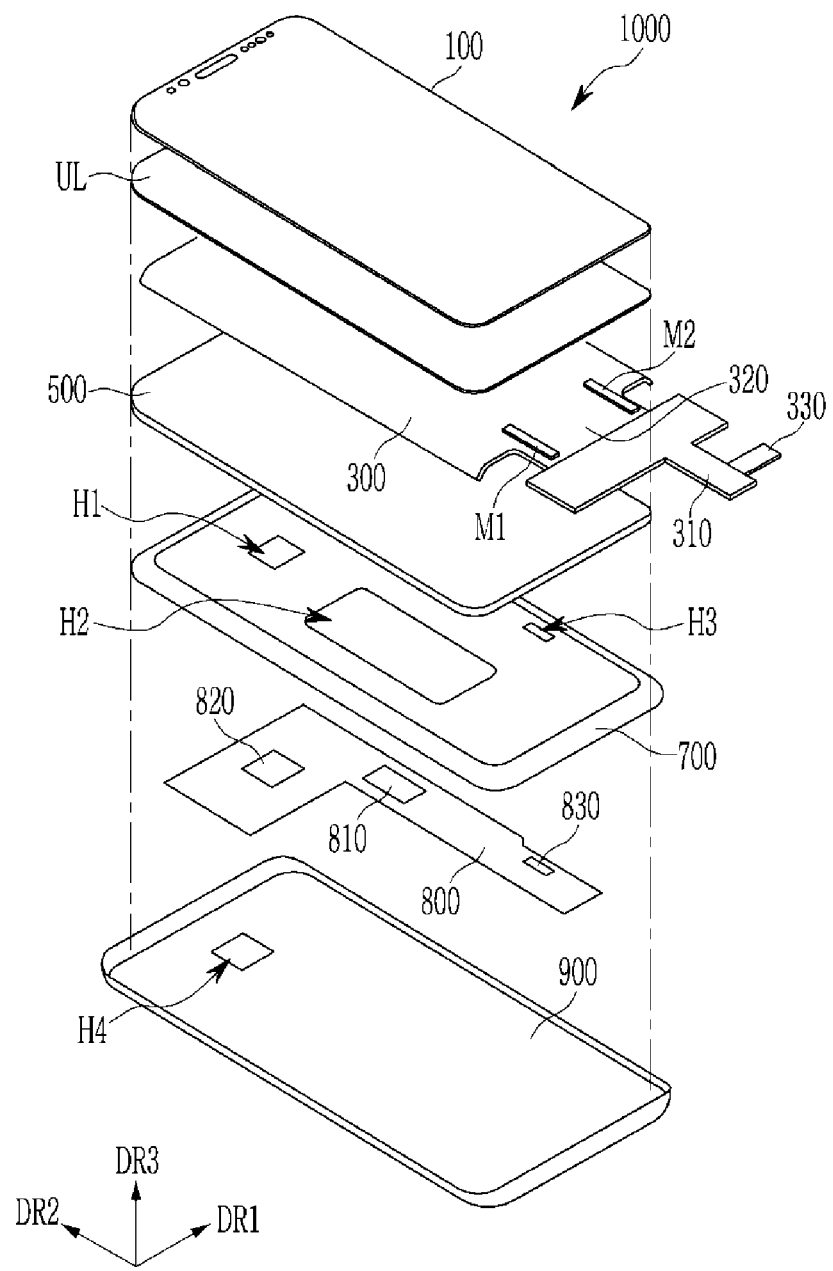
FIG. 2 is an exploded perspective view of a display device according to an embodiment.

First, a display device according to an embodiment is described with refence to FIG. 1 and FIG. 2. FIG. 1 is a perspective view of a display device according to an embodiment that is constructed according to principles of the invention, and FIG. 2 is an exploded perspective view of a display device according to an embodiment.

Referring to FIG. 1, the display device 1000 may have a generally rectangular planar shape, and may have a short side extending in a direction parallel to the first direction DR1 and a long side extending in a direction parallel to the second direction DR2. However, this is an example, and the planar shape of the display device is not limited thereto and may have a polygonal, circular, or elliptical planar shape.

The display device 1000 may generally include a display area DA that emits light toward the third direction DR3.

The display area DA may include a first display area DA10 having a substantially flat surface and a second display area DA20 extending from the edge of the first display area DA10.

The second display area DA20 may include first sub-display areas DA1 extending from the first display area DA10 along the first direction DR1 and the second direction DR2, and a second sub-display area DA2 extending from the corner of the first display area DA10 and disposed between the first sub-display areas DA1. The second display area DA20 may have a curved plane shape. However, the second display area DA20 may be flat, and when the second display area DA20 is flat, the first display area DA10 and the second display area DA20 may form a certain angle with each other.

The first sub-display area DA1 may include four regions connected to each of the four sides of the first display area DA10 or may include only some of them. Each of the first sub-display areas DA1 has a curved surface and may form a curved screen. The curvature of the first sub-display area DA1 may be constant or different depending on the position on the curved surface. The first sub-display area DA1 may have a shape similar to a part (e.g., ¼) of the side surface of a curved column such as a circular column or an elliptical column.

The second sub-display area DA2 may be disposed at four corners or some corners of the display device 1000, respectively. The second sub-display area DA2 may be disposed between the adjacent first sub-display areas DA1. Each of the second sub-display areas DA2 has a curved surface and form a curved screen. The curvature of the second sub-display area DA2 may be constant or different depending on the position on the curved surface. The shape of the curved surface of the second sub-display area DA2 may be different from that of the first sub-display area DA1. The second sub-display area DA2 may have a shape similar to that of a part (e.g., ⅛) of a curved body such as a sphere or an ellipse.

When viewing the display device 1000 from the front, the entire first display area DA10 and at least some of the first sub-display areas DA1 and the second sub-display areas DA2 of the second display area DA20 may be combined, thereby the overall corners may be recognized as the screen of the rounded rectangle.

According to the shown embodiment, it is described that the second display area DA20 is extended along the edge of the first display area DA10, however it is not limited thereto and the second display area DA20 may be disposed only on both sides or one side of the first display area DA10.

Referring to FIG. 2, the display device 1000 may include a cover window 100, a display panel 300, an optical sensor 500, a frame 700, a main circuit board 800, and a lower cover 900.

The cover window 100 is disposed on the display panel 300 to cover the upper surface of the display panel 300, so that the upper surface of the display panel 300 may be protected.

The cover window 100 may be made of glass, sapphire, and/or plastic. The cover window 100 may be rigid or flexible.

Referring to FIG. 2 along with FIG. 1, the cover window 100 may have a planar shape such as the first display area DA10 having a substantially flat surface and the second display area DA20 extending from the edge of the first display area DA10 to have the curved plane.

The cover window 100 may be attached to the upper surface of the display panel 300 through an adhesive member. The adhesive member may be a layer having an adherence such as an optically clear adhesive film (OCA), an optically clear resin (OCR), etc.

A polarization film UL may be disposed between the display panel 300 and the cover window 100. The polarization film UL may prevent deterioration of visibility due to reflection of external light. The polarization film UL may be omitted in some implementations of the embodiment.

The display panel 300 may include a light emitting element. For example, the display panel 300 is an organic light emitting panel using organic light emitting diodes, a micro light emitting diode (LED) display panel using a micro light emitting diode (LED) (a micro LED), or a quantum dot light emitting display panel including a quantum dot light emitting diode. However, the display panel 300 is not limited thereto and may include various flat display units including a plurality of pixels.

The display circuit board 310 may be attached to two edges facing along the second direction DR2 among the edges of the display panel 300. The display circuit board 310 is connected to the protruded part 320 of the display panel 300. A plurality of pads connected to a plurality of signal lines of the display panel 300 are disposed on the protruded part 320 of the display panel 300, and the display circuit board 310 may be connected to a plurality of pads disposed on the protruded part 320 of the display panel 300 using an anisotropic conductive film. The width of the protruded part 320 of the display panel 300 may be smaller than the width of the display panel 300.

A cable 330 may be connected to the display circuit board 310 and the cable 330 may be connected to a main circuit board 800, which will be described later in more detail.

The protruded part 320 of the display panel 300 and the display circuit board 310 disposed between the display panel 300 and the display circuit board 310 may be bent below the display panel 300. In detail, the protruded part 320 of the display panel 300 and the display circuit board 310 may be bent to the surface side of the opposite direction to the surface facing the cover window 100 along the third direction DR3 among the surfaces of the display panel 300.

A part of the protruded part 320 of the display panel 300 disposed between the display panel 300 and the display circuit board 310 may form a bending region BR, which will be described later in more detail.

A first mark M1 and a second mark M2 are disposed in the protruded part 320 of the display panel 300 disposed between the display panel 300 and the display circuit board 310. The first mark M1 and the second mark M2 are marks to determine whether the protruded part 320 is bent to the correct position when the protruded part 320 of the display panel 300 is bent. This will be described in more detail later. In the following embodiment, it is described that the first mark M1 and the second mark M2 are disposed on the protruded part 320 of the display panel 300, but are not limited thereto, and the first mark M1 and the second mark M2 may be disposed in the bending region BR that is bent among the display panel 300.

The optical sensor 500 may be disposed under the display panel 300. According to the illustrated embodiment, the optical sensor 500 is disposed on the entire area under the display panel 300, but is not limited thereto, and may be disposed to correspond to some regions of the display panel 300.

The optical sensor 500 may be an optical fingerprint recognition sensor capable of recognizing a user's fingerprint using an optical method. The optical sensor 500 may be omitted in some implementations of the embodiment.

The frame 700 and the main circuit board 800 may be disposed between the display panel 300 and the lower cover 900.

The frame 700 may have a first opening H1 into which a camera device 820 is inserted, and a second opening H2 through which a battery is disposed and a third opening H3 through which the cable 330 connected to the display circuit board 310 passes.

The main circuit board 800 may include a main processor 810, a camera device 820, and a main connector 830.

The cable 330 passed through the third opening H3 of the frame 700 may be connected to the main connector 830 of the main circuit board 800.

The lower cover 900 may be fastened and fixed with the frame 700. The lower cover 900 may include at least one of plastic and metal.

The lower cover 900 may have a fourth opening H4 into which the camera device 820 is inserted to be protruded to the outside.

However, the position of the camera device 820 and the position of the openings H1 and H4 to which the camera device 820 is attached are not limited thereto.

Figure 3:
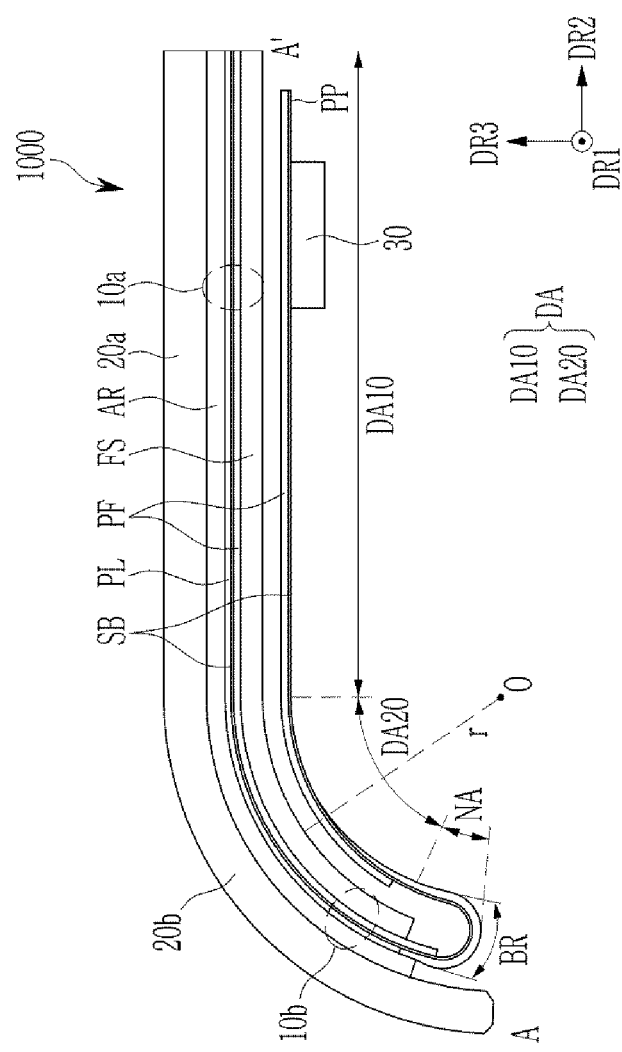
FIG. 3 is a cross-sectional view of a display device according to an embodiment.
Figure 4:
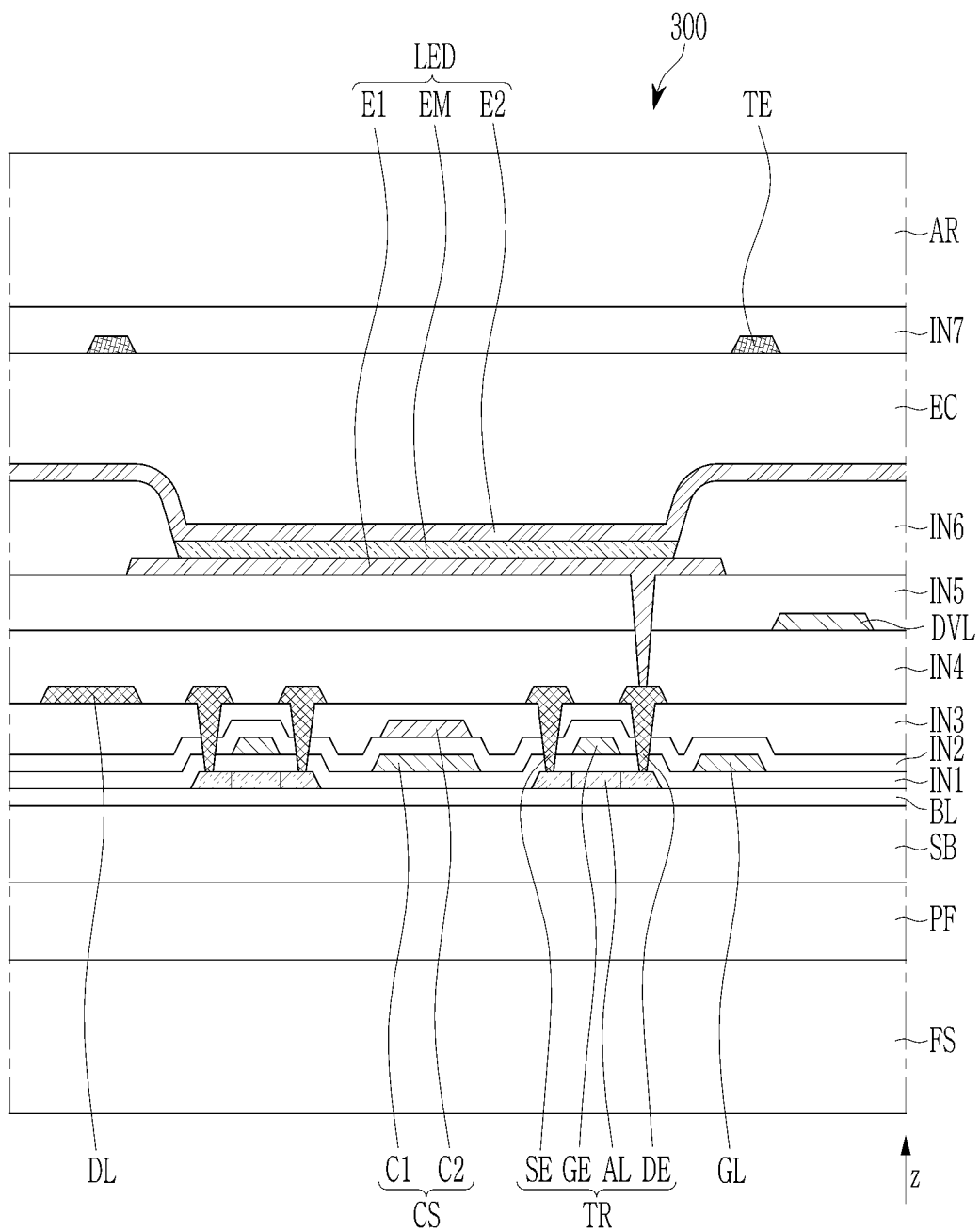
FIG. 4 is a cross-sectional view showing a stacked structure of a display panel of a display device according to an embodiment.

Now, a part of the display device according to an embodiment is described with reference to FIG. 3 and FIG. 4. FIG. 3 is a cross-sectional view taken along a line A-A' of FIG. 1 in a display device according to an embodiment, and FIG. 4 is a cross-sectional view showing a stacked structure of a display panel of a display device according to an embodiment.

Referring to FIG. 3, the display panel 300 includes a display area DA displaying an image and a non-display area NA around the display area DA. At least a part of the display panel 300 is flexible. The display panel 300 includes a pixel layer PL where the pixels are arranged on the substrate SB, and a combination of the pixels displays the image. The pixels including, for example, red pixels, green pixels, and blue pixels are arranged in the first display area DA10 as well as the second display area DA20.

On the substrate SB of the display panel 300, wires that transmit the signals to drive the pixels are disposed. The wires may include data lines, gate lines, and driving voltage lines that are disposed of in the display area DA, and may include connection wires that are disposed of in the non-display area NA. The display panel 300 may be a light emitting display panel including light emitting elements. The display panel 300 may include a touch sensor layer capable of detecting a user's touch. In the drawing, the display panel 300 is shown to include several layers. In addition to the pixel layer PL, the display panel 300 may include layers such as an antireflection layer AR, a protective film PF, and a functional sheet FS. The specific structure of the display panel 300 is described later in more detail.

The display panel 300 includes a pad part PP in which pads for receiving signals (including power) from the outside (i.e., external to the display device 1000) are arranged. The pad part PP may be connected to the display circuit board 310. The signals (e.g., touch detection signals generated by the display panel 300 may be externally output through the pad part PP.

The display panel 300 includes the bending region BR between the second display area DA20 and the pad part PP. The bending region BR may be a part of the protruded part 320 of the display panel 300 described above. The bending region BR may extend along the first direction DR1. The bending region BR may be bent so that the part of the protruded part 320 of the display panel 300 and the display circuit board 310 and the pad part PP are disposed on the rear surface of the display panel 300. The bending region BR may be bent to have an interior diameter of about 1 mm or less, about 0.5 mm or less, or for example, about 0.3 mm, based on the bending axis parallel to the first direction DR1. The bending region BR may be included in the non-display area NA.

The window 100 is a kind of cover that protects the display panel 300 from external impact. The window 100 may act as a support to maintain the curved state of the display panel 300. The window 100 is made of a transparent and hard material such as glass or plastic so that the user may see the image displayed on the screen of the display panel 300.

The display device 1000 includes a driving device that generates and/or processes various signals for driving the display panel 300. The driving device may include a data driver that applies a data voltage to the data line, a gate driver that applies a gate signal to the gate line, and a signal controller that controls the data driver and the gate driver. The gate driver may be integrated as a driving circuit outside the second display area DA20 in the display panel 300. The data driver and the signal controller may be provided as an integrated circuit chip 30. The integrated circuit chip 30 may be mounted on the protruded part 320 of the display panel 300 and may be disposed between the bending region BR and the pad part PP. However, the integrated circuit chip 30 may be mounted on a flexible printed circuit film connected to the pad part PP of the display panel 300.

The display device 1000 is generally flat in the first display area DA10, and is curved with a predetermined curvature in the second display area DA20 to have the curved surface. The curvature radius r of the second display area DA20 forming the curved surface may be constant or variable depending on the position. The display panel 300 includes a flat region 10a corresponding to the first display area DA10 and a curved region 10b corresponding to the second display area DA20 forming the curved surface. Similarly, the window 100 includes a flat region 20a corresponding to the first display area DA10 and a curved region 20b corresponding to the second display area DA20 forming the curved surface. In the cross-sectional view, the curvature center of the curved region 20b of the window 100 may coincide with or almost coincide with the curvature center O of the curved region 10b of the display panel 300. The curvature radius of the curved region 20b of the window 100 may be larger than the curvature radius r of the curved region 10b of the display panel 300.

The display panel 300 may be attached to the window 100 by an adhesive such as an optically clear adhesive film (OCA) or an optically clear resin (OCR), and an adhesive layer may be disposed between the display panel 300 and the window 100. The flat region 10a of the display panel 300 may be attached to the flat region 20a of the window 100 and the curved region 10b of the display panel 300 may be attached to the curved region 20b of the window 100. The flat region 10a of the display panel 300 in its entirety may be the first display area DA10. The curved region 10b of the display panel 300 is mostly the second display area DA20, but may include the non-display area NA outside the second display area DA20.

The bending region BR and the protruded part 320 of the display panel 300 are disposed on the rear of the window 100, but they may be disposed on the rear (hereinafter, it is referred to as the rear of the display panel 300 unless otherwise specified) of the flat region 10a and the curved region 10b of the display panel 300 without being adhered to the window 100.

Now, an example of the stacked structure of the display area DA of the display panel 300 of the display device 1000 is described with reference to FIG. 4.

The display panel 300 may basically include a substrate SB, a transistor TR formed on the substrate SB, and a light emitting diode (LED) LED connected to the transistor TR. The light emitting diode LED may correspond to a pixel.

The substrate SB may be a flexible substrate made of a polymer such as polyimide, polyamide, or polyethylene terephthalate. The substrate SB may include a barrier layer to prevent penetration of moisture, oxygen, and the like. For example, the substrate SB may include at least one polymer layer and at least one barrier layer, and a polymer layer and a barrier layer may be alternately stacked.

A buffer layer BL may be disposed on the substrate SB. The buffer layer BL may include an inorganic insulating material such as a silicon oxide or a silicon nitride.

The semiconductor layer AL of the transistor TR may be disposed on the buffer layer BL and the insulating layer IN1 may be disposed on the semiconductor layer AL. The semiconductor layer AL may include a source region, a drain region, and a channel region between these regions. The semiconductor layer AL may include a semiconductor material such as polysilicon, an oxide semiconductor, or amorphous silicon.

A first conductor, which may include a gate electrode GE of the transistor TR, a gate line GL, and a first electrode C1 of the capacitor CS, and may be disposed on the insulating layer IN1.

An insulating layer IN2 may be disposed on the first conductor. A second conductor, which may include a second electrode C2 of the capacitor CS, may be disposed on the insulating layer IN2. The first conductor and/or the second conductor may include a metal such as molybdenum (Mo), copper (Cu), aluminum (Al), silver (Ag), chromium (Cr), tantalum (Ta), titanium (Ti), and the like.

An insulating layer IN3 may be disposed on the insulating layer IN2 and the second conductor. The insulating layers IN1, IN2, and IN3 may include an inorganic insulating material.

A third conductor, which may include a source electrode SE and a drain electrode DE of the transistor TR, a data line DL, and the like, may be disposed on the insulating layer IN3. The source electrode SE and the drain electrode DE maybe connected to the source region and the drain region of the semiconductor layer AL through openings of the insulating layers IN1, IN2, and IN3.

An insulating layer IN4 may be disposed on the third conductor. A fourth conductor that may include a driving voltage line DVL or the like may be disposed on the insulating layer IN4. The third conductor and the fourth conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), and nickel (Ni), or metal alloys thereof.

An insulating layer IN5 may be disposed on the fourth conductor. The insulating layers IN4 and IN5 may include an organic insulating material.

A first electrode E1 of the light emitting diode LED may be disposed on the insulating layer IN5. The first electrode E1 may be referred to as the pixel electrode. The first electrode E1 is connected to the drain electrode DE through the openings of the insulating layers IN4 and IN5 to receive the data signal that controls the luminance of the light emitting diode LED. The transistor TR to which the first electrode E1 is connected may be a driving transistor or may be a transistor electrically connected to the driving transistor.

An insulating layer IN6 may be disposed on the insulating layer IN5. The insulating layer IN6 may be referred to as a pixel defining layer, and may have an opening overlapping the first electrode E1. In the opening of the insulating layer IN6, a light emitting member EM including an emission layer may be disposed above the first electrode E1, and a second electrode E2 may be disposed above the light emitting member EM. The second electrode E2 may be referred to as a common electrode.

The first electrode E1, the light emitting member EM, and the second electrode E2 may constitute a light emitting diode LED that may be an organic light emitting diode. The first electrode E1 and the second electrode may be an anode and a cathode of the light emitting diode LED, respectively.

An encapsulation layer EC may be disposed on the second electrode E2. The encapsulation layer EC prevents the penetration of moisture or oxygen from the outside by encapsulating the light emitting diode LED. The encapsulation layer EC may be a thin film encapsulation layer including at least one inorganic material layer and at least one organic material layer.

A touch sensor layer including a touch electrode (TE) may be disposed on the encapsulation layer EC. The touch electrode TE may have a mesh shape having an opening overlapping the light emitting diode LED. A buffer layer may be disposed between the encapsulation layer EC and the touch sensor layer. An insulating layer IN7 covering the touch electrode TE may be disposed on the touch sensor layer.

An anti-reflection layer AR for reducing reflection of external light may be disposed on the insulating layer IN7. The anti-reflection layer AR may include a polarization layer. The anti-reflection layer AR may be attached by an adhesive or formed on the insulating layer IN7. Instead of the anti-reflection layer AR, the encapsulation layer EC, the touch sensor layer, and/or the insulating layer IN7 may be formed in a refractive index matching structure to obtain an anti-reflection effect. The layers disposed between the substrate SB and the anti-reflection layer AR may correspond to the above-described pixel layer PL.

A protection film PF to protect the display panel 300 may be disposed under the substrate SB. The protection film PF may be made of a polymer such as polyethylene terephthalate, polyethylene naphthalate, or polyimide. In order to reduce the bending stress of the bending region BR, the protection film PF may not be disposed in the bending region BR in some implementations of this embodiment. A bending protective layer (a stress relief layer) may be disposed in the bending region BR so that the wires disposed in the bending region BR are not broken or damaged.

A functional sheet FS including at least one of a cushion layer, a heat dissipation sheet, a light shielding sheet, a waterproof tape, and an electromagnetic blocking film may be disposed under the protection film PF. The functional sheet FS may not be disposed in the bending region BR and the pad part PP in some implementations of this embodiment.

The position and arrangement of the above devices may be variously changed according to the design.

Figure 5:
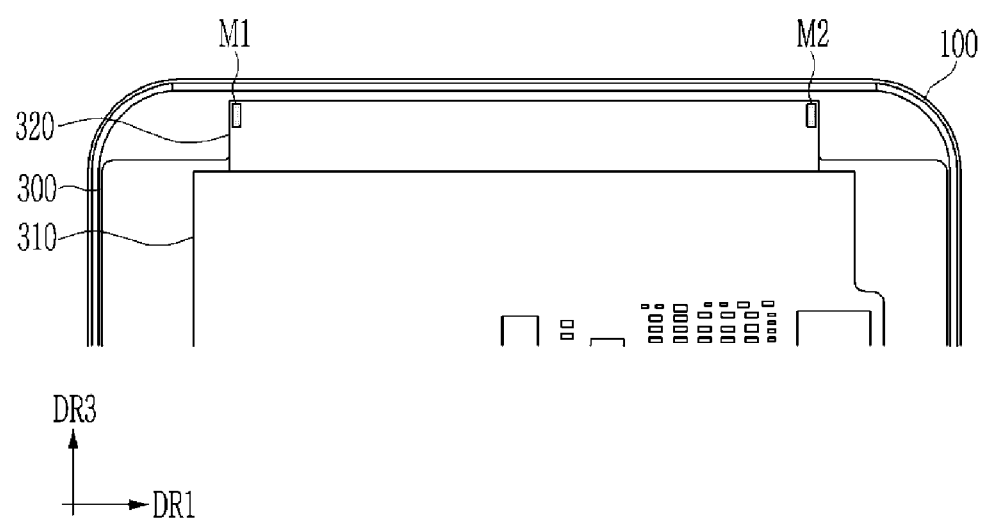
FIG. 5 is a top plan view showing a part of a display device according to an embodiment.
Figure 6:
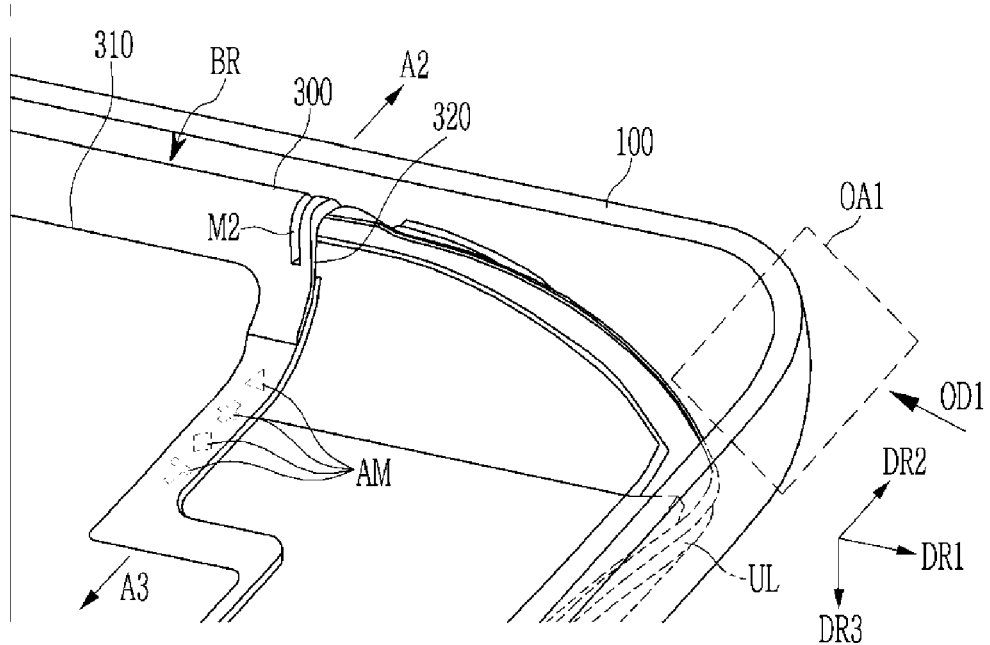
FIG. 6 is a perspective view showing a part of a display device according to an embodiment.
Figure 7:
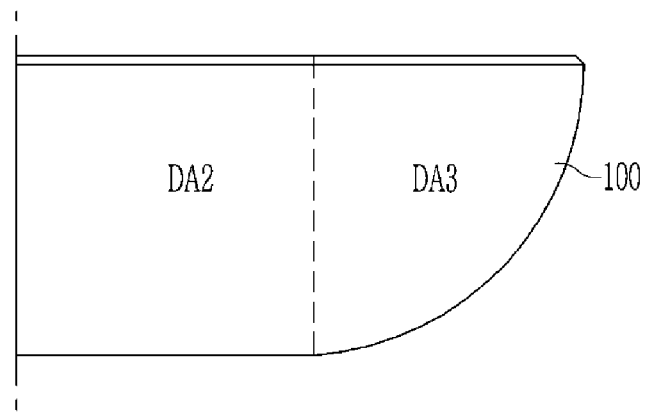
FIG. 7 and FIG. 8 are side views showing a part of a display device according to an embodiment on a side surface.
Figure 8:
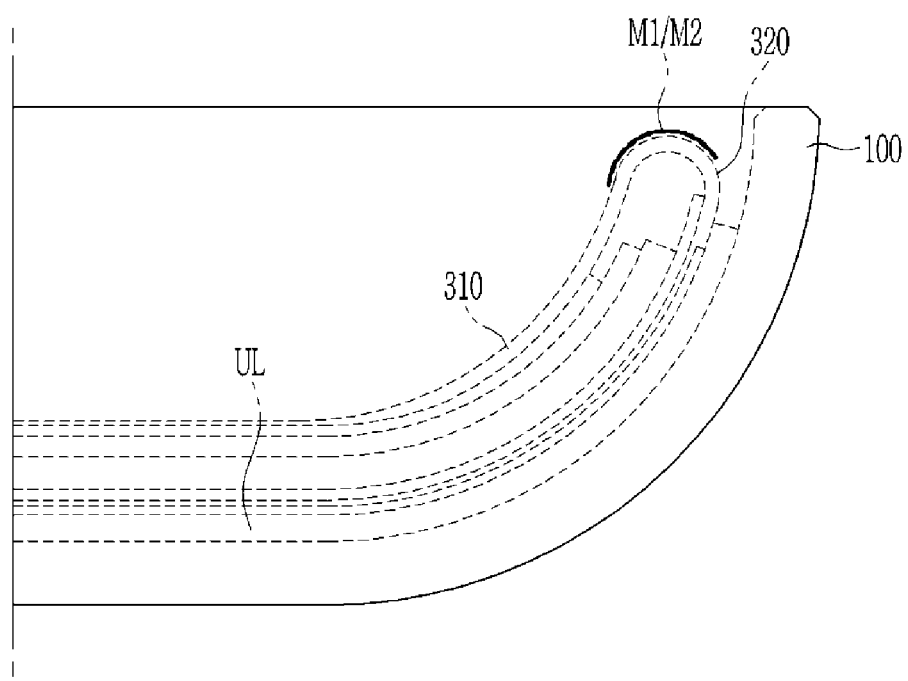

Now, a part of the display device according to an embodiment will be described with reference to FIGS. 5 to 8 along with FIGS. 1 to 3. FIG. 5 is a top plan view showing a part of a display device according to an embodiment, and FIG. 6 is a perspective view showing a part of a display device according to an embodiment. FIG. 7 and FIG. 8 are side views showing a part of a display device according to an embodiment on a side surface.

First, referring to FIG. 5 and FIG. 6 along with FIG. 1 to FIG. 3, when assembling the display device 1000, the front side displaying the image of the display panel 300 is toward the window 100 side, and the rear side, which is the side opposite to the front side that displays the image, is attached facing the lower cover 900.

The first sub-display area DA1 of the second display area DA20 of the display panel 300 may be disposed at both ends along the first direction DR1, and the first sub-display area DA1 of the second display area DA20 may be bent. In addition, the first sub-display area DA1 of the second display area DA20 of the display panel 300 may be disposed at both ends along the second direction DR2, and the first sub-display area DA1 of the second display area DA20 may be bent. In addition, the second sub-display area DA2 of the second display area DA20 may be disposed at the corner of the display device 1000, and the second sub-display area DA2 of the second display area DA20 may be bent.

As described above, the display circuit board 310 may be attached to the protruded part 320 of the display panel 300, and the bending region BR of the protruded part 320 of the display panel 300 may be bent, so that the part of the protruded part 320 of the display panel 300 and the display circuit board 310 is disposed so as to be adjacent to the rear of the display panel 300.

A plurality of alignment marks AM are disposed on the back of the display panel 300, and the first mark M1 and the second mark M2 are disposed on the front of the bending region BR of the protruded part 320 of the display panel 300.

A plurality of alignment marks AM may be formed as grooves on a transparent substrate, and the first mark M1 and the second mark M2 may be formed to have an identifiable pattern such as a mark or a groove by using a lithography process or a laser.

The bending region BR of the protruded part 320 of the display panel 300 is bent in a direction parallel to the first direction DR1 as a rotation axis, and the first mark M1 and the second mark M2 may be arranged in a direction perpendicular to the first direction DR1, that is, a direction parallel to the second direction DR2.

When the bending region BR of the protruded part 320 of the display panel 300 is bent and disposed to be adjacent to the rear surface of the display panel 300, a plurality of alignment marks AM be used to determine whether any part of the protruded part 320 of the display panel 300 is placed on the rear surface of the display panel 300 or the accuracy of the position of the part disposed on the back surface of the display panel 300 among the protruded part 320 of the display panel 300.

In addition, the first mark M1 and the second mark M2 may be used to determine a bending degree of the bending region BR of the protruded part 320 of the display panel 300, that is, the first mark M1 and the second mark M2 may be used to determine how far the bending region BR of the protruded part 320 of the display panel 300 is apart from the edge of the window 100 (also referred to hereinbelow as 'cover window' 100) and how it is bent to have any degree of the curvature.

The bending region BR of the protruded part 320 of the display panel 300 may be bent in a direction parallel to the first direction DR1 as a rotation axis and may be arranged in a direction perpendicular to the first direction DR1. After the bending of the bending region BR of the protruded part 320 of the display panel 300, a part of the first mark M1 and the second mark M2 may be disposed to face the window side and the other part thereof may be disposed to be visually recognized when looking at the rear of the display panel 300. That is, one end of the first mark M1 and the second mark M2 may be disposed adjacent to the window and the other end of the first mark M1 and the second mark M2 may be disposed on a plane parallel to the rear surface of the display panel 300.

Unlike a plurality of alignment marks AM, the portion of each of the first mark M1 and the second mark M2 may not overlap with the rest portion of each of the first mark M1 and the second mark M2 along the first direction DR1 parallel to the rotation axis during the bending and the direction vertical to the extending direction of the first mark M1 and the second mark M2, that is, the direction vertical to the surface of the display panel 300.

According to the bending curvature of the bending region BR of the protruded part 320 of the display panel 300, the length of the visible part of the first mark M1 and the second mark M2 may be changed. For example, when the curvature is relatively large when the protruded part 320 of the display panel 300 is bent, the length of the portion that is visible when looking at the back of the display panel 300 among the first mark M1 and the second mark M2 may be relatively short, and when the curvature is relatively small when the protruded part 320 of the display panel 300 is bent, the length of the portion that is visible of the first mark M1 and the second mark M2 may be relatively long. Therefore, it is possible to measure the accuracy of the bending through the change in the length of the visible part of the first mark M1 and the second mark M2 by observing in the direction viewing the back of the display panel 300 in a direction forming a certain non-zero angle with the third direction DR3.

Referring to FIG. 7 and FIG. 8, the result of observing the observation region OA1 in the observation direction OD1 disposed on the side surface of the display panel 300 along the first direction DR1 parallel to the bending axis of the bending region BR is described.

As described above, the first sub-display area DA1 of the second display area DA20 of the display panel 300 may be disposed at both ends along the first direction DR1, and the first sub-display area DA1 of the second display area DA20 may be bent. In addition, the second sub-display area DA2 of the second display area DA20 may be disposed at the corner of the display device 1000, and the second sub-display area DA2 of the second display area DA20 may be bent.

Therefore, when observing the observation region OA1 in the observation direction OD1, which is disposed on the side surface of the display panel 300 along the first direction DR1 parallel to the bending axis of the bending region BR, the first sub-display area DA1 and the second sub-display area DA2 of the second display area DA20 are observed. The first sub-display area DA1 and the second sub-display area DA2 of the second display area DA20 are curved to have the curvature along the curved region of the window 100, and the layers such as the pixel layer PL, the anti-reflection layer AR, the protection film PF, and the functional sheet FS may be disposed.

In general, according to the display device that includes the first display area DA10, does not include the second display area DA20, or at least does not include the second sub-display area DA2 of the second display area DA20, the accuracy of the bending of the bending region BR of the protruded part 320 of the display panel 300 may be measured by observing the side surface of the bending region BR from the side surface of the display panel 300 along the first direction DR1 parallel to the bending axis of the bending region BR. However, like the display device according to an embodiment, in the case of the display device where the second display area DA20 is disposed to surround the edge of the first display area DA10 and the second display area DA20 is also bent, as shown in FIG. 8, when being observed from the side surface of the display panel 300 along the first direction DR1, the bending region BR is covered by the second display area DA20, and accordingly, it is difficult to observe the side surface of the bending region BR from the side surface of the display panel 300 along the first direction DR1.

Figure 9:
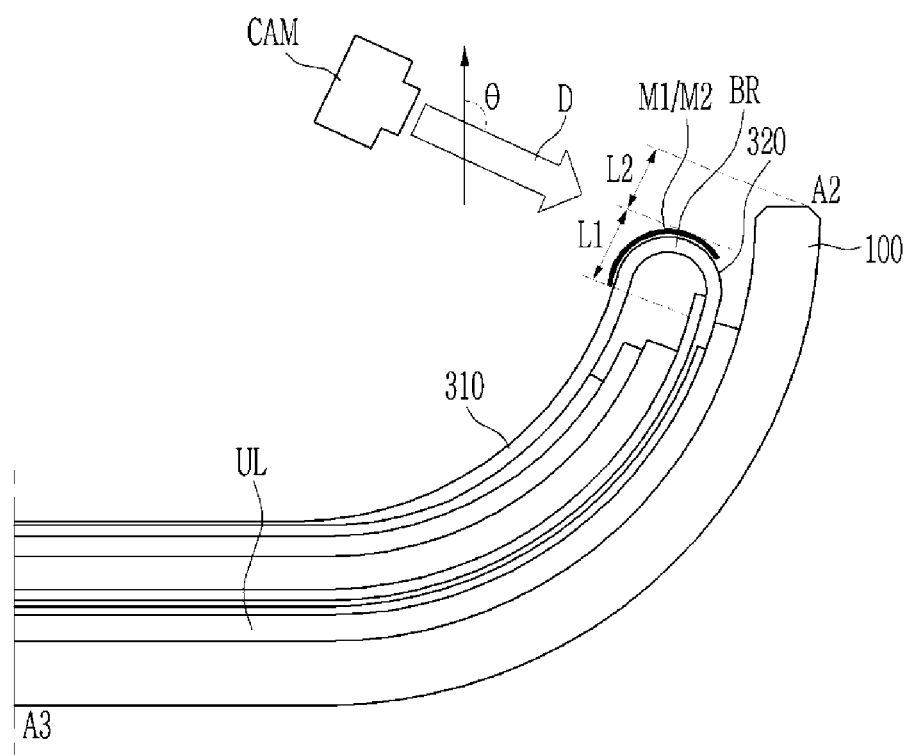
FIG. 9 is a cross-sectional view showing an inspection method of a display device according to an embodiment.
Figure 10:
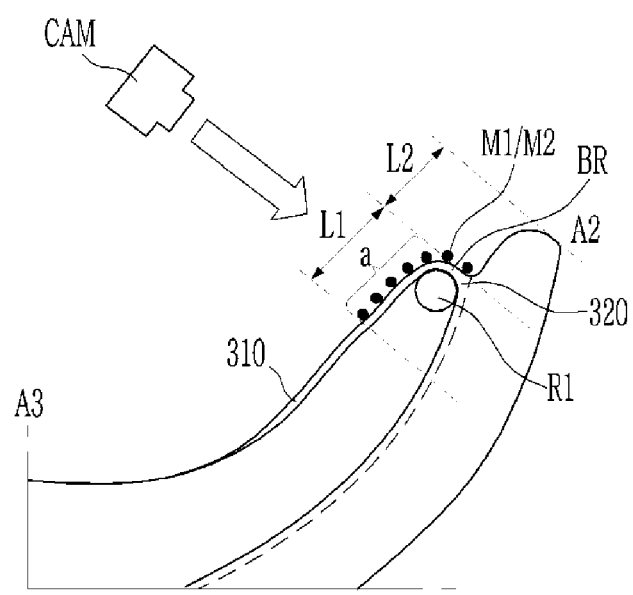
FIG. 10 and FIG. 11 are cross-sectional views showing an example of an inspection result of a display device according to an embodiment.
Figure 11:
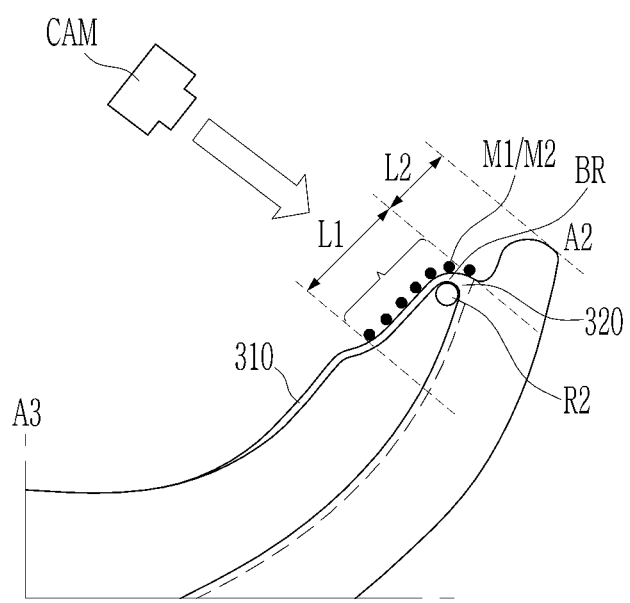

Next, an inspection method of the display device according to an embodiment is described with reference to FIG. 9 to FIG. 11 as well as FIG. 5 to FIG. 8. FIG. 9 is a cross-sectional view of a display device bounded by planes A2 and A3 shown in FIG. 6, showing an inspection method of a display device according to an embodiment, and FIG. 10 and FIG. 11 are cross-sectional views of a display device bounded by planes A2 and A3 shown in FIG. 6, showing an example of an inspection result of a display device according to an embodiment.

Referring to FIG. 9 along with FIG. 5 and FIG. 6, the inspection method of the display device according to an embodiment may include bending the bending region BR of the protruded part 320 of the display panel 300 in the direction parallel to the first direction DR1 as the rotation axis and detecting a first length L1 of the portion that is visible among the first mark M1 and the second mark M2 by using a detecting unit CAM in the direction D viewing the back of the display panel 300 in the direction forming a first angle θ by the third direction DR3 and a second length L2, which is a minimum length from the edge of the window 100 to the end of the first mark M1 and the second mark M2.

Depending on the bending curvature of the protruded part 320 of the display panel 300 and the display circuit board 310, the first length L1 and the second length L2 may be changed.

The inspection method of the display device according to an embodiment may include comparing the values of the first length L1 and the second length L2 measured by the detecting unit CAM with a predetermined value to determine whether there is a defect.

FIG. 10 shows an example of a case in which the curvature is relatively large when the protruded part 320 of the display panel 300 is bent, and FIG. 11 shows an example of a case where the curvature is relatively small when the protruded part 320 of the display panel 300 is bent.

Referring to FIG. 10 and FIG. 11, when the bending region BR of the protruded part 320 of the display panel 300 is bent, when it is bent to have a relatively large first curvature radius R1 compared to the case where it is bent to have a relatively small second curvature radius R2, the first length L1 of the visually recognized part among the first mark M1 and the second mark M2 may be relatively short, and the second length L2, which is the minimum length from the edge of the window 100 to the ends of the first mark M1 and second mark M2, may be relatively long.

Therefore, the first length L1 of the visually recognized part among the first mark M1 and the second mark M2 is detected, the second length L2 of the minimum length from the edge of the window 100 to the end of the first mark M1 and the second mark M2 is detected through the detecting unit CAM, and they are compared with a predetermined value, thereby it is possible to inspect the accuracy of the bending.

The detecting unit CAM may also be used to inspect the accuracy of the position of the bending portion of the display panel 300 by using a plurality of alignment marks AM. More specifically, by adjusting the observation angle of the detecting unit CAM, in the direction from the direction vertical to the rear plane of the display panel 300 toward the rear of the display panel 300, that is, in the direction parallel to the third direction DR3, by detecting the position of a plurality of alignment marks AM by observing the rear surface of the display panel 300, it is possible to inspect the accuracy of the position of the bending portion of the display panel 300.

The detecting unit CAM may be a camera, but is not limited thereto.

Conventionally, the bending region BR of the protruded part 320 of the display panel 300 was directly observed along the first direction DR1, that is, both side surfaces of the display device 1000, to inspect the accuracy of the bending. However, as described with reference to FIG. 7 and FIG. 8 above, In the case of the display device according to the embodiment including the second display area DA20, which is bent and extended to two ends disposed on both sides along the first direction DR1 parallel to the rotation axis during bending, when being observed from both sides of the display device 1000 disposed on both sides along the first direction DR1, since the bending region BR of the protruded part 320 of the display panel 300 is disposed within the window 100 and is covered by the second display area DA20, this inspection method is difficult to apply to the display device including the second display area DA20 that is bent and expanded to two ends of the window 100, the two ends disposed on both sides along the first direction DR1 parallel to the rotation axis when bending.

However, according to the display device and the inspection method thereof according to one or more embodiments, by using a plurality of alignment marks AM disposed on the rear of the display panel 300 and the first mark M1 and the second mark M2 disposed on the front of the bending region BR of the protruded part 320 of the display panel 300, the accuracy of the bending may be determined by observing the bending region BR in the direction facing the back rather than the side surface of the display panel 300. Specifically, a plurality of alignment marks AM may be used to determine the accuracy of the position of the protruded part 320 of the display panel 300 and the bent part of the display circuit board 310, and simultaneously, the first mark M1 and the second mark M2 may be used to determine how far the bending region BR of the protruded part 320 of the display panel 300 is apart from the edge of the window 100 and how it is bent so as to have a degree of curvature.

Next, an example of the first mark and the second mark of the display device according to an embodiment is described with reference to FIG. 12 to FIG. 17. FIG. 12 to FIG. 17 are views showing an example of a first mark and a second mark of a display device according to an embodiment.

In FIG. 12 to FIG. 15, (a) shows a shape before the bending of the first mark M1 and the second mark M2 and (b) shows a shape after the bending. The shape before the bending of the first mark M1 and the second mark M2 is the shape observed facing the front of the display panel 300, and the shape after the bending of the first mark M1 and the second mark M2 is a conceptual illustration of the shape observed from both sides of the display device 1000 disposed on both sides along the first direction DR1.

Figure 16:
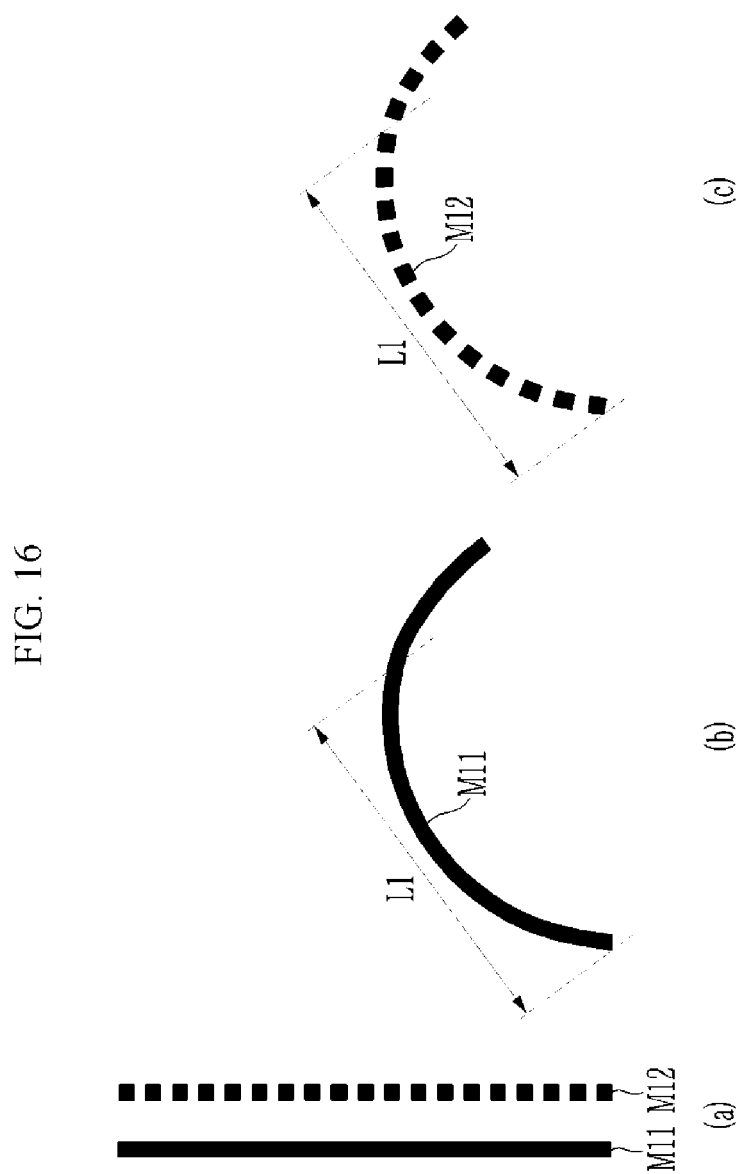
Figure 17:
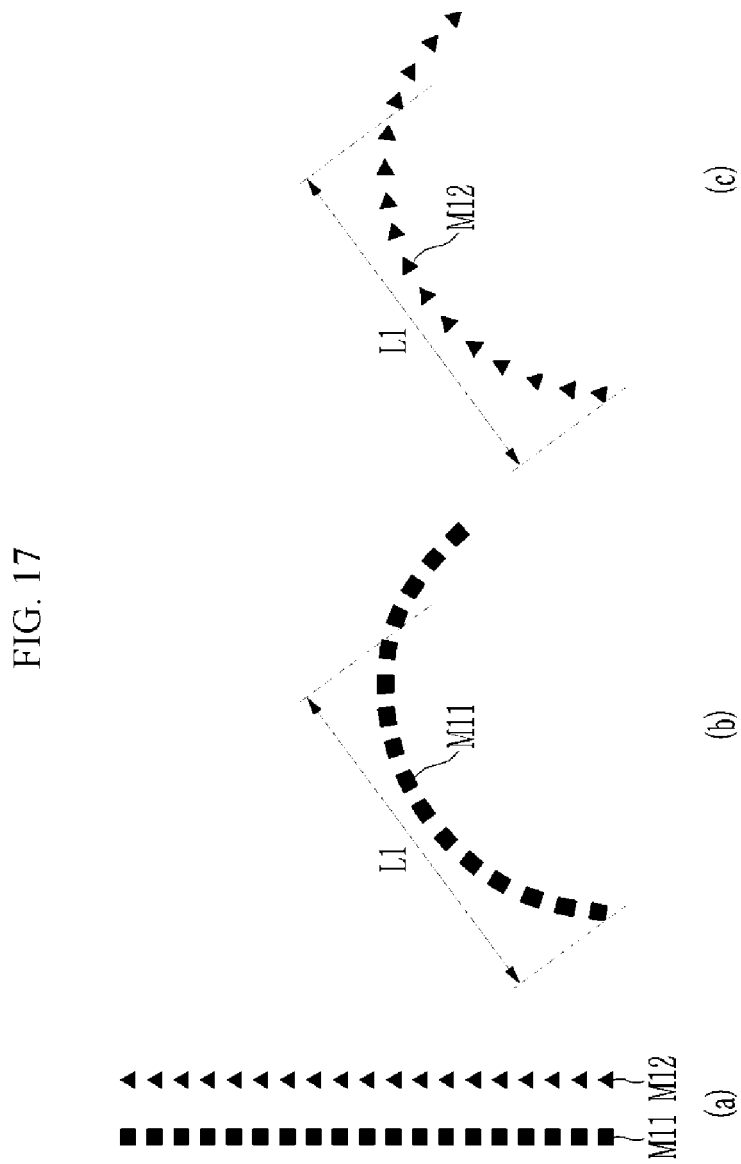

In FIG. 16 and FIG. 17, (a) is the shape before the bending of the first mark M1 and the second mark M2, far (b) and the (c) are the shape after the bending. The shape before the bending of the first mark M1 and the second mark M2 is the shape observed facing the front of the display panel 300, and the shape after the bending of the first mark M1 and second mark M2 is a conceptual illustration of the shape observed from both sides of the display device 1000 disposed on both sides along the first direction DR1.

Figure 12:
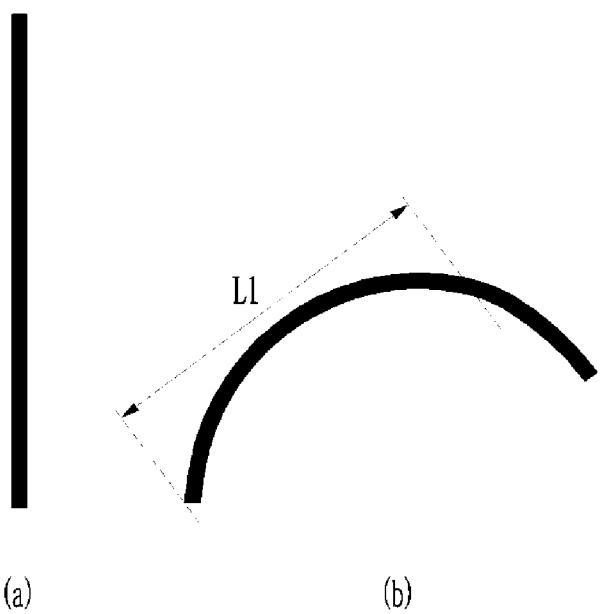
FIGS. 12, 13, 14, 15, 16, and 17 are views showing an example of a first mark and a second mark of a display device according to an embodiment.

Referring to FIG. 12, the first mark M1 and the second mark M2 of the display device according to an embodiment may include a straight line shape extending in the direction parallel to the second direction DR2. When the first mark M1 and the second mark M2 are formed in the straight line shape, it may be easy to measure the first length L1 of the visually recognized part of the first mark M1 and the second mark M2.

Figure 13:
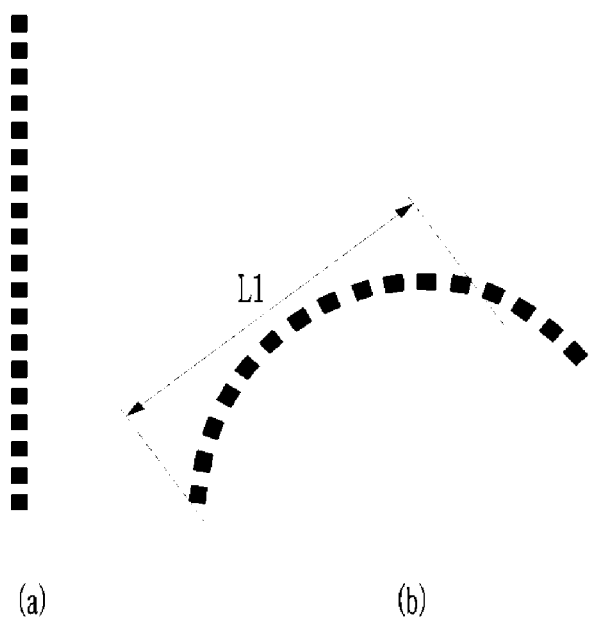

Referring to FIG. 13, the first mark M1 and the second mark M2 of the display device according to an embodiment may include a plurality of quadrangle patterns arranged in the direction parallel to the second direction DR2.

When forming the first mark M1 and the second mark M2 to include a plurality of quadrangle patterns arranged in a line, the number of the quadrangle patterns recognized in addition to the first length L1 of the visible portion of the first mark M1 and the second mark M2 may be detected to be used to the inspection method.

Figure 14:
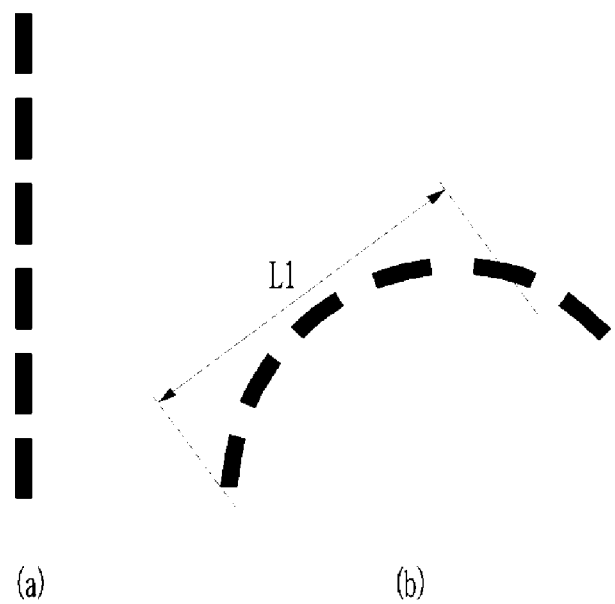

Referring to FIG. 14, the first mark M1 and the second mark M2 of the display device according to an embodiment may include a plurality of rectangle patterns arranged in the direction parallel to the second direction DR2.

When forming the first mark M1 and the second mark M2 to include a plurality of rectangle patterns arranged in a line, similarly to the embodiment shown in FIG. 9, the number of the rectangle patterns recognized in addition to the first length L1 of the visible portion of the first mark M1 and the second mark M2 may be detected to be used in the inspection method. Also, compared with FIG. 9, since the number of the patterns is small, the number of the patterns may be detected relatively easily.

Figure 15:
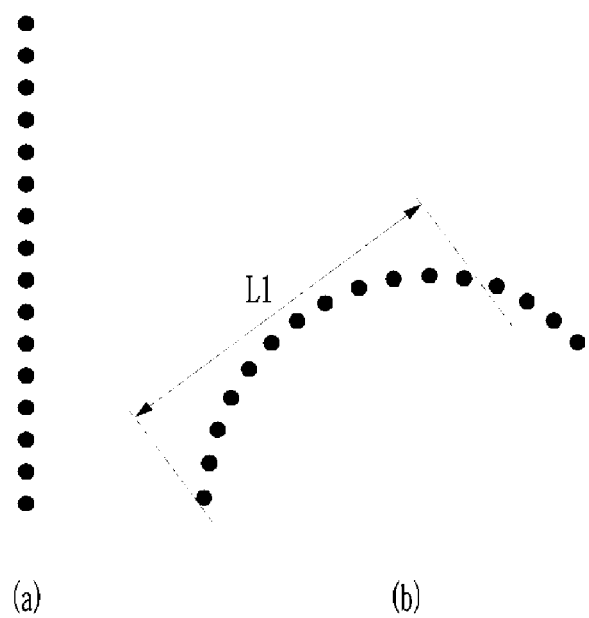

Referring to FIG. 15, the first mark M1 and the second mark M2 of the display device according to an embodiment may include a plurality of circular patterns arranged in the direction parallel to the second direction DR2.

When forming the first mark M1 and the second mark M2 to include a plurality of circular patterns arranged in a line, the number of the visually recognized circular patterns other than the first length L1 of the visually recognized portion of the first mark M1 and the second mark M2 may be detected to be used to the inspection method.

Referring to FIG. 16, the first mark M1 and the second mark M2 of the display device according to an embodiment may include a first sub-mark M11 and a second sub-mark M12 that are disposed adjacent to each other. The first sub-mark M11 may have a straight line shape extending in the direction parallel to the second direction DR2, and the second sub-mark M12 may include a plurality of quadrangle patterns arranged in the direction parallel to the second direction DR2.

In this way, when the first mark M1 and the second mark M2 are formed to include the first sub-mark M11 and the second sub-mark M12 that are disposed adjacent to each other, the first length L1 of the visually recognized part of the first mark M1 and the second mark M2 may be measured by using the first sub-mark M11 and the number of the visually recognized quadrangle patterns by using the second sub-mark M12 may be detected to be used in the inspection method, thereby increasing the accuracy of the detection method.

Referring to FIG. 17, the first mark M1 and the second mark M2 of the display device according to an embodiment may include a first sub-mark M11 and a second sub-mark M12 that are disposed adjacent to each other. The first sub-mark M11 may include a plurality of quadrangle patterns arranged in a direction parallel to the second direction DR2, and the second sub-mark M12 may include a plurality of triangle patterns arranged in a direction parallel to the second direction DR2.

In this way, when the first mark M1 and the second mark M2 are formed to include the first sub-mark M11 and the second sub-mark M12 that are disposed adjacent to each other, the first length L1 of the visible part of the first mark M1 and the second mark M2 may be measured by using the first sub-mark M11, and at the same time, the shape of the triangle pattern may be detected by using the second sub-mark M12, thereby determining together whether the position is deformed along the first direction DR1 parallel to the rotation axis during the bending.

According to the display device and the inspection method thereof according to the one or more embodiments, by using a plurality of alignment marks AM disposed on the rear of the display panel 300, and the first mark M1 and the second mark M2 disposed on the front of the protruded part 320 of the display panel 300 and extending in the direction vertical to the rotation axis during the bending, the detection may be performed in the direction facing the rear side rather than the side surface of the display panel 300, thereby determining the accuracy of the position of the bent part and simultaneously determining how far it is away from the edge of the window 100 and how it is bent to have much curvature.

According to one or more of the embodiments described above, it has been described that the protruded part 320 of the display panel 300 is bent, but this is an example, and it is also possible that the part of the display panel 300 may be the bending part that is all bent, and in this case, the first mark and the second mark may be disposed on the bending part to be bent.

Although certain embodiments and implementations have been described herein, other embodiments and modifications will be apparent from this description. Accordingly, the inventive concepts are not limited to such embodiments, but rather to the broader scope of the appended claims and various modifications and equivalent arrangements as would be apparent to a person of ordinary skill in the art.

What is claimed is:

1. A display device comprising:
a display panel including a bending region bent along an axis extending in a first direction;
a window disposed on a first surface of the display panel; and
a mark disposed on the bending region of the display panel along a second direction different from the first direction,
wherein each portion of the mark does not overlap a remainder of the mark along a direction perpendicular to the first surface of the display panel on which the window is disposed,
wherein a first end of the mark is disposed adjacent to the window, and
wherein a second end of the mark is disposed on a plane parallel to a second surface of the display panel opposite to the first surface of the display panel, and
wherein the first end and the second end are disposed on first and second sides of the display device along the first direction of the display panel and are curved surfaces.

2. The display device of claim 1, wherein
a first side surface and a second side surface are disposed on the first and second sides along the first direction of the display panel and are curved surfaces.

3. The display device of claim 1, wherein
the display panel includes a first display area and a second display area extending from an edge of the first display area to surround the first display area,
the first display area is a relatively flat surface, and the second display area is a relatively curved surface.

4. The display device of claim 1, wherein
the mark has a straight line shape extending in the second direction.

5. The display device of claim 1, wherein
the mark includes a plurality of patterns arranged in the second direction.

6. The display device of claim 5, wherein
the mark includes one or more of a plurality of quadrangle patterns, a plurality of circle patterns, and a plurality of triangle patterns.

7. The display device of claim 1, wherein
the mark includes a first sub-pattern and a second sub-pattern, and
at least one of the first sub-pattern and the second sub-pattern includes a plurality of patterns arranged in the second direction.

8. The display device of claim 7, wherein
one of the first sub-pattern and the second sub-pattern has a straight line shape extending in the second direction.

9. An electronic device comprising:
the display device according to claim 1.

10. An inspection method of a display device, comprising:
forming a mark in a bending region of a display panel that is configured to be bent from a first surface of the display panel on which a window is disposed;
bending the bending region of the display panel along an axis extending in a first direction;
detecting a position of an edge of the window disposed on the first surface of the display panel and a position of the mark; and
inspecting the bending region by using the detected positions,
wherein the mark extends along a second direction different from the first direction,
wherein, in the detecting of the positions, the detecting is performed by using a detecting unit at a position viewing a second surface of the display panel disposed on an opposite side with respect to the first surface along a direction forming a non-zero angle with the second direction,
wherein, in the detecting of the positions, a first length of a portion of the mark that is visually recognized along the second direction by the detecting unit is detected, and
wherein, in the detecting of the positions, a second length that corresponds to a minimum interval between the recognized portion of the mark and the edge of the window is detected.

11. The inspection method of the display device of claim 10, wherein
the first side surface and the second side surface disposed on first and second sides of the display device along the first direction of the window and the display panel form a curved surface.

12. The inspection method of the display device of claim 10, wherein
the mark is formed to have a straight line shape extending in the second direction.

13. The inspection method of the display device of claim 10, wherein
the mark is formed to include a plurality of patterns arranged in the second direction.

14. The inspection method of the display device of claim 13, wherein
in the detecting of the positions, a number of recognized patterns of the plurality of patterns of the mark along the second direction is detected.

15. The inspection method of the display device of claim 14, wherein
the mark is formed with one or more of a plurality of quadrangle patterns, a plurality of circular patterns, and a plurality of triangle patterns.

16. The inspection method of the display device of claim 15, wherein
the mark is formed to include a first sub-pattern and a second sub-pattern, and
at least one of the first sub-pattern and the second sub-pattern is formed with a plurality of patterns arranged in the second direction.

* * * * *